United States Patent
Park et al.

(10) Patent No.: US 9,178,483 B1
(45) Date of Patent: Nov. 3, 2015

(54) MULTILAYER CHIP ELECTRONIC COMPONENT AND BOARD HAVING THE SAME

(71) Applicant: SAMSUNG ELECTRO-MECHANICS CO., LTD., Suwon-Si, Gyeonggi-Do (KR)

(72) Inventors: Min Cheol Park, Suwon-Si (KR); Sang Soo Park, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/457,069

(22) Filed: Aug. 11, 2014

(30) Foreign Application Priority Data

May 8, 2014 (KR) .................. 10-2014-0054598

(51) Int. Cl.
*H03H 7/01* (2006.01)
*H01G 4/12* (2006.01)
*H03H 1/00* (2006.01)

(52) U.S. Cl.
CPC .............. *H03H 7/0115* (2013.01); *H01G 4/12* (2013.01); *H03H 2001/0085* (2013.01)

(58) Field of Classification Search
CPC ............ H03H 2001/0085; H03H 7/0115; H01G 4/12
USPC .................. 333/175, 185; 361/306.3
See application file for complete search history.

(56) References Cited

U.S. PATENT DOCUMENTS

| 5,476,728 A * | 12/1995 | Nakano et al. ............... 428/815 |
| 2012/0162853 A1 | 6/2012 | Togashi |
| 2012/0169434 A1 * | 7/2012 | Masuda et al. ............... 333/185 |

FOREIGN PATENT DOCUMENTS

| EP | 2048777 A1 | 4/2009 |
| JP | 2000-021640 A | 1/2000 |
| JP | 2006-295111 A | 10/2006 |
| JP | 2008-035122 A | 2/2008 |
| JP | 2009-290677 A | 12/2009 |
| JP | 2012-138415 A | 7/2012 |

* cited by examiner

*Primary Examiner* — Benny Lee
*Assistant Examiner* — Rakesh Patel
(74) *Attorney, Agent, or Firm* — McDermott Will & Emery LLP

(57) ABSTRACT

A multilayer chip electronic component may include: a ceramic body including a plurality of dielectric layers; an inductor part disposed within the ceramic body and including first and second internal electrodes; a capacitor part disposed within the ceramic body and including third to fifth internal electrodes; and first and second external electrodes disposed on first and second end surfaces of the ceramic body, a third external electrode extended from second main surface of the ceramic body to first and second side surfaces, and a fourth external electrode extended from first main surface of the ceramic body to the first and second side surfaces. The capacitor part may include first and second capacitor parts and the inductor part and the capacitor part are connected to each other.

10 Claims, 5 Drawing Sheets

MULTILAYER CHIP ELECTRONIC COMPONENT AND BOARD HAVING THE SAME

CROSS-REFERENCE TO RELATED APPLICATION

This application claims the benefit of Korean Patent Application No. 10-2014-0054598 filed on May 8, 2014, with the Korean Intellectual Property Office, the disclosure of which is incorporated herein by reference.

BACKGROUND

The present disclosure relates to a multilayer chip electronic component and a board having the same.

In accordance with rapid growth of the market for small portable terminals due to the emergence of smart phones or tablet personal computers (PCs), multifunctionalization, miniaturization, and thinning of portable terminals have been further intensified.

Among these, since wireless communications circuits have been modularized, they require decreases in volumes thereof, in addition to multiband correspondence.

Meanwhile, as processing performance of a central processing unit (CPU) of a base band part is improved, wireless modules or radio frequency (RF) analog circuits are driven at high frequency to be subjected to electromagnetic wave interference from peripheral circuits, such that communications disruption may easily occur.

Meanwhile, an LC filter, a multilayer chip electronic component, is mounted on printed circuit boards of various electronic products including display devices such as liquid crystal displays (LCDs), plasma display panels (PDPs) and the like, computers, smartphones, mobile phones, and the like, to serve as an electronic component for suppressing noise.

In accordance with the miniaturization of portable terminals, demand for such LC filters to be reduced in size while having high efficiency have also been required.

In addition, along with the rapid development of mobile terminals such as tablet personal computers (PCs), ultra books, and the like, the miniaturization and high integration of microprocessors have been conducted.

Therefore, an area of a printed circuit board is decreased and correspondingly, a space for mounting the LC filter is limited, such that multilayer chip electronic components satisfying the limited mounting space have been continuously requested.

Further, since portable terminals are being used within higher frequency ranges than ever, LC filters having excellent efficiency in such high frequency regions are required.

RELATED ART DOCUMENT (Patent Document 1) Japanese Patent Laid-Open Publication No. 2012-138415

SUMMARY

An exemplary embodiment in the present disclosure may provide a multilayer chip electronic component and a board having the same.

According to an exemplary embodiment in the present disclosure, a multilayer chip electronic component may include: a ceramic body including a plurality of dielectric layers and having first and second main surfaces opposing each other, first and second side surfaces opposing each other, and first and second end surfaces opposing each other; an inductor part formed within the ceramic body and including first and second internal electrodes, the first internal electrode being exposed to the first side surface and the first end surface, and the second internal electrode being exposed to the first side surface and the second end surface; a capacitor part formed within the ceramic body and including third to fifth internal electrodes, the third internal electrode being exposed to the first and second side surfaces, the fourth internal electrode being exposed to the first end surface, and the fifth internal electrode being exposed to the second end surface; and first and second external electrodes formed on the first and second end surfaces of the ceramic body and electrically connected to the first and second internal electrodes and the fourth and fifth internal electrodes, a third external electrode extended from the second main surface of the ceramic body to the first and second side surfaces and connected to the third internal electrode, and a fourth external electrode extended from the first main surface of the ceramic body to the first and second side surfaces and connected to the first and second internal electrodes, wherein the capacitor part is composed of first and second capacitor parts and the inductor part and the capacitor part are connected to each other.

The fourth and fifth internal electrodes may be formed on a single dielectric layer to be insulated from each other.

The fourth and fifth internal electrodes may be separately formed on the individual dielectric layers.

The first internal electrode may be connected to the fourth internal electrode through the first external electrode and the second internal electrode maybe connected to the fifth internal electrode through the second external electrode, such that the inductor part and the capacitor part may be connected to each other.

The inductor part may be formed so that a signal input to the first external electrode sequentially passes through the first and second internal electrodes and is then output to the second external electrode.

According to an exemplary embodiment in the present disclosure, a board having a multilayer chip electronic component may include: a printed circuit board having first to third electrode pads disposed thereon; and the multilayer chip electronic component mounted on the printed circuit board, wherein the multilayer chip electronic component includes: a ceramic body including a plurality of dielectric layers and having first and second main surfaces opposing each other, first and second side surfaces opposing each other, and first and second end surfaces opposing each other, an inductor part formed within the ceramic body and including first and second internal electrodes, the first internal electrode being exposed to the first side surface and the first end surface, and the second internal electrode being exposed to the first side surface and the second end surface, a capacitor part formed within the ceramic body and including third to fifth internal electrodes, the third internal electrode being exposed to the first and second side surfaces, the fourth internal electrode being exposed to the first end surface, and the fifth internal electrode being exposed to the second end surface, and first and second external electrodes formed on the first and second end surfaces of the ceramic body and electrically connected to the first and second internal electrodes and the fourth and fifth internal electrodes, a third external electrode extended from the second main surface of the ceramic body to the first and second side surfaces and connected to the third internal electrode, and a fourth external electrode extended from the first main surface of the ceramic body to the first and second side surfaces and connected to the first and second internal electrodes, the capacitor part being composed of first and second capacitor parts and the inductor part and the capacitor part being connected to each other.

The fourth and fifth internal electrodes may be formed on a single dielectric layer to be insulated from each other.

The fourth and fifth internal electrodes may be separately formed on the individual dielectric layers.

The first internal electrode may be connected to the fourth internal electrode through the first external electrode and the second internal electrode may be connected to the fifth internal electrode through the second external electrode, such that the inductor part and the capacitor part may be connected to each other.

The inductor part may be formed so that a signal input to the first external electrode sequentially passes through the first and second internal electrodes and is then output to the second external electrode.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
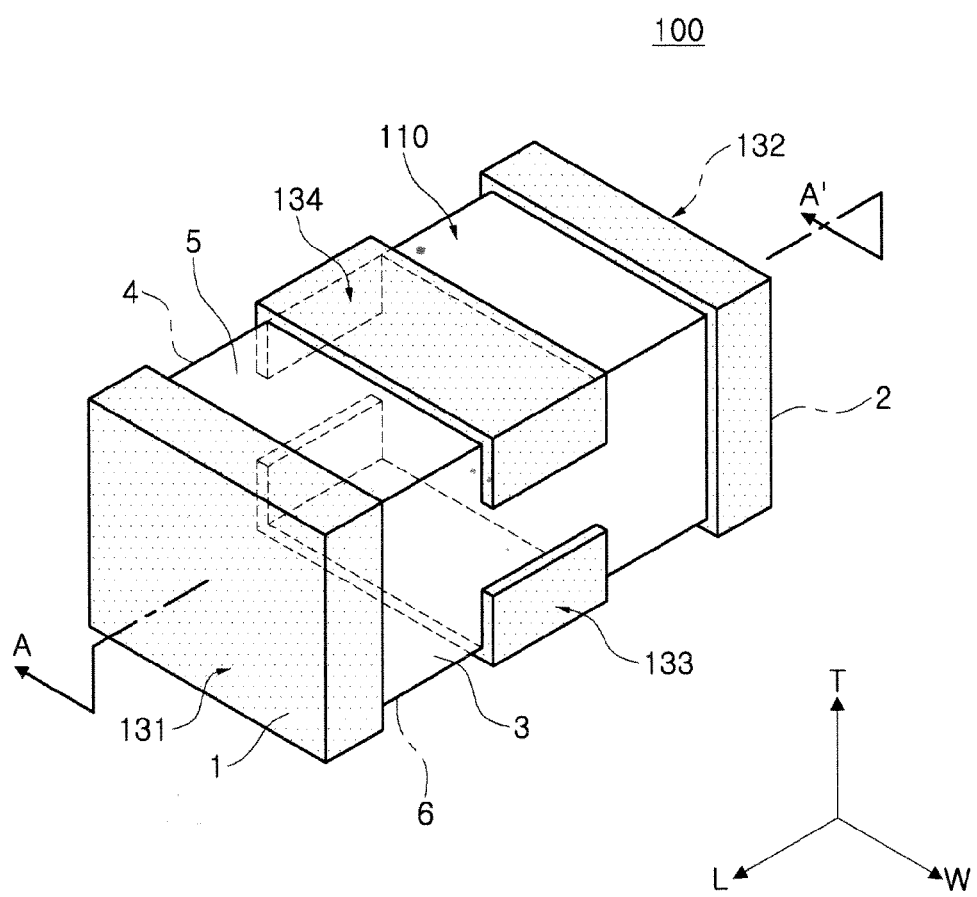
FIG. 1 is a perspective view of a multilayer chip electronic component according to an exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Directions of a hexahedron will be defined in order to clearly describe exemplary embodiments of the present disclosure. L, W and T shown in the accompanying drawings refer to a length direction, a width direction, and a thickness direction, respectively. Here, the thickness direction may be used to have the same concept as a stacking direction in which dielectric layers are stacked.

Multilayer Chip Electronic Component

Hereinafter, exemplary embodiments of the present disclosure will be described in detail with reference to the accompanying drawings.

FIG. 1 is a perspective view of a multilayer chip electronic component according to an exemplary embodiment of the present disclosure.

Figure 2:
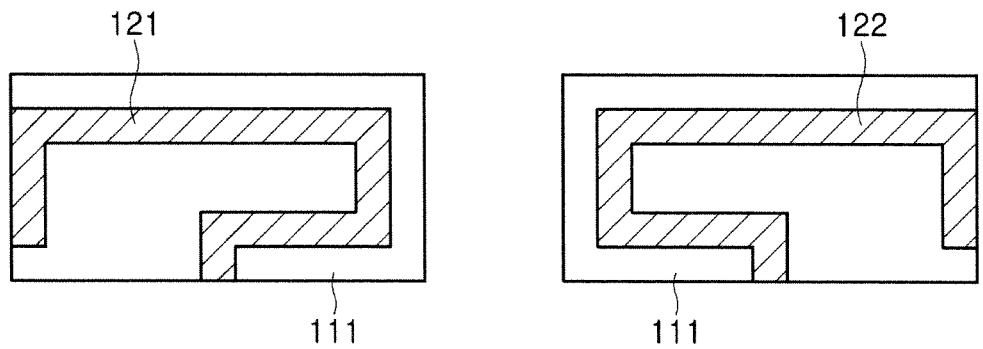
FIG. 2 is a plan view illustrating first and second internal electrodes usable in the multilayer chip electronic component shown in FIG. 1.

FIG. 2 is a plan view illustrating first and second internal electrodes usable in the multilayer chip electronic component shown in FIG. 1.

Figure 3:
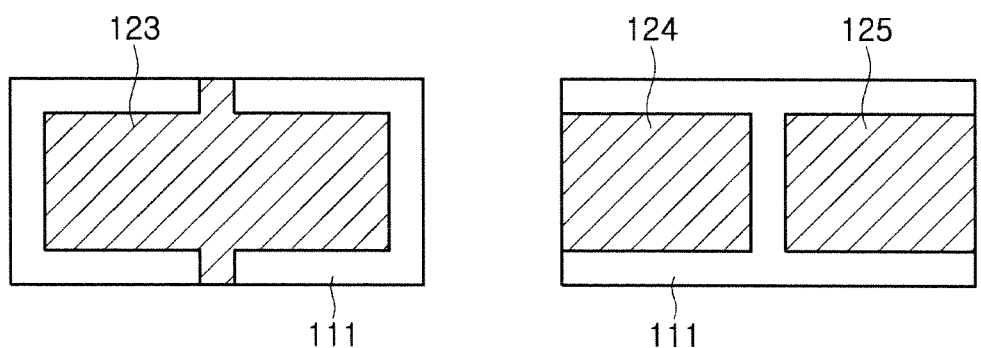
FIG. 3 is a plan view illustrating third to fifth internal electrodes usable together with the first and second internal electrodes shown in FIG. 2.

FIG. 3 is a plan view illustrating third to fifth internal electrodes usable together with the first and second internal electrodes shown in FIG. 2.

Referring to FIGS. 1 through 3, a multilayer chip electronic component 100 according to an exemplary embodiment of the present disclosure may include a ceramic body 110 including a plurality of dielectric layers 111 and having first and second main surfaces opposing each other, first and second side surfaces opposing each other, and first and second end surfaces opposing each other.

In the exemplary embodiment, the ceramic body 110 may have first and second main surfaces 5 and 6 opposing each other, and first and second side surfaces 3 and 4 and first and second end surfaces 1 and 2 that connect the first and second main surfaces 5 and 6 to each other.

A shape of the ceramic body 110 is not particularly limited, but may be a hexahedral shape as shown in the exemplary embodiment.

The ceramic body 110 may be formed by stacking the plurality of dielectric layers, and a plurality of internal electrodes are separated from one another with each of the dielectric layers interposed therebetween in the ceramic body 110.

The dielectric layers 111 configuring the ceramic body 110 may be in a sintered state and be integrated with each other so that boundaries between adjacent dielectric layers are not readily apparent.

The dielectric layers 111 may be formed by sintering ceramic green sheets containing a ceramic powder, an organic solvent, and an organic binder. The ceramic powder may have a high k-material and examples thereof may include a barium titanate ($BaTiO_3$) based material, a strontium titanate ($SrTiO_3$) based material, and the like. However, the ceramic powder is not limited thereto.

Meanwhile, as described below, dielectric layers forming a capacitor part may be formed using the ceramic powder, and dielectric layers forming an inductor part L may be formed using a Ni—Cu—Zn based ferrite material, a Ni—Cu—Zn—Mg based ferrite material, or a Mn—Zn based ferrite material, but the present disclosure is not limited thereto.

The multilayer chip electronic component 100 may include the inductor part L formed within the ceramic body 110 and including first and second internal electrodes 121 and 122, the first internal electrode 121 being exposed to the first side surface 3 and the first end surface 1, and the second internal electrode 122 being exposed to the first side surface 3 and the second end surface 2.

According to an exemplary embodiment of the present disclosure, the first and second internal electrodes 121 and 122 may be formed of a conductive paste containing a conductive metal.

The conductive metal may be nickel (Ni), copper (Cu) palladium (Pd), or an alloy thereof, but is not limited thereto.

The internal electrodes may be printed on the ceramic green sheets forming the dielectric layers using the conductive paste by a printing method such as a screen printing method or a gravure printing method.

The ceramic green sheets on which the internal electrodes are printed may be alternately stacked and sintered, thereby forming the ceramic body.

In addition, the multilayer chip electronic component 100 may include the capacitor part formed within the ceramic body 110 and including third to fifth internal electrodes 123 to 125, the third internal electrode 123 being exposed to the first and second side surfaces 3 and 4, the fourth internal electrode 124 being exposed to the first end surface 1, and the fifth internal electrode 125 being exposed to the second end surface 2.

The capacitor part may be formed by the third internal electrode 123 and the fourth and fifth internal electrodes 124 and 125, and the fourth and fifth internal electrodes 124 and 125 that are insulated from each other on a single dielectric layer 111 and the third internal electrode 123 may configure first and second capacitor parts C1 and C2, respectively, and may be connected to each other in parallel.

The third to fifth internal electrodes 123 to 125 are not particularly limited, but may be formed using, for example, a conductive paste containing a conductive metal, similarly to the first and second internal electrodes 121 and 122.

The conductive metal may be nickel (Ni), copper (Cu), palladium (Pd), or an alloy thereof, but is not limited thereto.

In addition, the multilayer chip electronic component 100 may include first and second external electrodes 131 and 132 formed on the first and second end surfaces 1 and 2 of the ceramic body 110 and electrically connected to the first and second internal electrodes 121 and 122 and the fourth and fifth internal electrodes 124 and 125, a third external electrode 133 extended from the second main surface 6 of the ceramic body 110 to the first and second side surfaces 3 and 4 and connected to the third internal electrode 123, and a fourth external electrode 134 extended from the first main surface 5 of the ceramic body 110 to the first and second side surfaces 3 and 4 and connected to the first and second internal electrodes 121 and 122.

According to an exemplary embodiment of the present disclosure, a mounting surface of the multilayer chip electronic component 100 may be the second main surface 6 of the ceramic body 110.

As described above, since the multilayer chip electronic component according to an exemplary embodiment of the present disclosure is mounted to be horizontal in relation to a board and the mounting surface thereof is the second main surface 6 of the ceramic body 110, although not shown in the drawings, a marking portion having a different color capable of being visibly distinguished may be further formed on one outermost dielectric layer in order to determine a mounting direction.

Therefore, the external electrodes contacting first to third electrode pads on a board on which the multilayer chip electronic component is mounted, to be described below, may be the first to third external electrodes 131 to 133.

In this case, the first external electrode 131 may function as a signal input terminal, the second external electrode 132 may function as a signal output terminal, and the third external electrode 133 may function as a ground terminal or an earth terminal.

According to an exemplary embodiment of the present disclosure, it may be understood that the remaining single external electrode 134 except for the first and second external electrodes 131 and 132 used as external terminals for connection with a power line and the third external electrode 133 used as the ground terminal may be used as a connection terminal for forming the inductor part L.

Therefore, the fourth external electrode 134 which is usable as the connection terminal for forming the inductor part L, may be a non-contact terminal in a state of non-contact with the power line as described above, and may be positioned on an upper surface of the multilayer chip electronic component when the multilayer chip electronic component is mounted on a board.

The first to fourth external electrodes 131 to 134 may be formed of a conductive paste including a conductive metal.

The conductive metal may be nickel (Ni), copper (Cu), tin (Sn), or an alloy thereof, but is not limited thereto.

The conductive paste may further contain an insulating material. The insulating material may be, for example, glass, but is not limited thereto.

A method of forming the first to fourth external electrodes 131 to 134 is not particularly limited. That is, the first to fourth external electrodes 131 to 134 may be formed on the ceramic body by a printing method, a dipping method, or another method such as a plating method, or the like.

Subsequently, a plating layer may be further formed on the first to fourth external electrodes 131 to 134.

The multilayer chip electronic component 100 may be a 3-terminal LC filter having a total of four external electrodes and three contact terminals, but the present disclosure is not limited thereto.

Hereinafter, the first to fifth internal electrodes 121 to 125 and the first to fourth external electrodes 131 to 134 among components of the multilayer chip electronic component 100 according to an exemplary embodiment of the present disclosure will be described in detail with reference to FIGS. 1 through 3.

Referring to FIG. 2, the inductor part L may be formed within the ceramic body 110 and include the first and second internal electrodes 121 and 122, the first internal electrode 121 being exposed to the first side surface 3 and the first end surface 1, and the second internal electrode 122 being exposed to the first side surface 3 and the second end surface 2 to thereby form inductance.

The first internal electrode 121 may be connected to the first and fourth external electrodes 131 and 134, and the second internal electrode 122 may be connected to the second and fourth external electrodes 132 and 134.

That is, a signal input to the first external electrode 131 used as the signal input terminal may pass through the first and second internal electrodes 121 and 122 via the fourth external electrode 134 provided as the connection terminal to thereby be output through the second external electrode 132 used as the signal output terminal, in a state in which noise of the signal is removed.

The inductor part L may be in a form of a coil part having 1.5 turns so that the signal input to the first external electrode 131 sequentially passes through the first internal electrode 121, the fourth external electrode 134, and the second internal electrode 122 and is then, output to the second external electrode 132.

That is, in the multilayer chip electronic component according to exemplary embodiments of the present disclosure, the inductor part L may be formed without using a through-hole electrode, whereby a manufacturing cost may be reduced.

In addition, since the through-hole electrode is not used, a connection defect between the through-hole electrode and the internal electrodes may not be present and a manufacturing yield may not be decreased.

Further, since the fourth external electrode 134 is used as a line of the signal as described above, heat generated due to loss of the internal electrodes may be discharged to the outside, such that an allowable current may be set to be high.

Referring to FIG. 3, the capacitor part may be formed in the ceramic body 110 and may include the third internal electrode 123 exposed to the first and second side surfaces 3 and 4, the fourth internal electrode 124 exposed to the first end surface 1, and the fifth internal electrode 125 exposed to the second end surface 2 to form a capacitance.

Particularly, in the capacitor part, the fourth and fifth internal electrodes 124 and 125 formed on a single dielectric layer 111 in a state in which they are insulated from each other and the third internal electrode 123 may configure first and second capacitor parts C1 and C2, respectively, and may be connected in parallel with each other.

The third internal electrode 123 may be disposed toward the second main surface 6, which is the mounting surface of the ceramic body, that is, in a lower portion of the ceramic body 110 in the thickness direction to thereby be connected to the third external electrode 133. The fourth and fifth internal electrodes 124 and 125 may also be disposed in the lower portion of the ceramic body 110 in the thickness direction and connected to the first and second external electrodes 131 and 132.

The first internal electrode 121 is connected to the fourth internal electrode 124 through the first external electrode 131 and the second internal electrode 122 is connected to the fifth internal electrode 125 through the second external electrode 132, such that the inductor part L and the capacitor parts C1 and C2 may be connected to each other.

The capacitor parts C1 and C2 may be disposed in the ceramic body 110 without particular limitations, and a plurality of capacitor parts may be stacked in order to implement a target capacitance.

The order of stacking the first to fifth internal electrodes 121 to 125 is not particularly limited.

For example, the first and second internal electrodes 121 and 122 configuring the inductor part L may be disposed in an upper portion of the ceramic body 110 in the thickness direction, and the third to fifth internal electrodes 123 to 125 configuring the capacitor part may be disposed toward the second main surface 6, which is the mounting surface of the ceramic body, that is, in the lower portion of the ceramic body 110 in the thickness direction.

In addition, although each of the first to fifth internal electrodes 121 to 125 shown in FIGS. 2 and 3 is provided in a singular number, actually, each of the first to fifth internal electrodes 121 to 125 may be provided in plural numbers.

In addition, pattern shapes of the first to fifth internal electrodes 121 to 125 shown in FIGS. 2 and 3 are provided by way of example according to an exemplary embodiment of the present disclosure, and the first to fifth internal electrodes 121 to 125 may have various pattern shapes in order to control inductance and capacitance.

Figure 4:
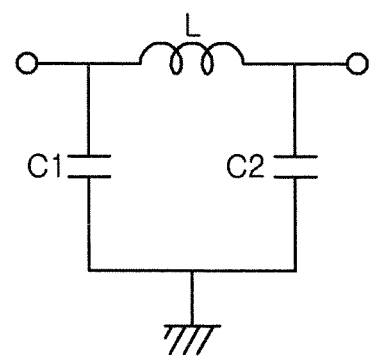
FIG. 4 is an equivalent circuit diagram of the multilayer chip electronic component shown in FIG. 1.

FIG. 4 is an equivalent circuit diagram of the multilayer chip electronic component shown in FIG. 1.

Referring to FIG. 4, the first capacitor part C1 including the third and fourth internal electrodes 123 and 124, the second capacitor part C2 including the third and fifth internal electrodes 123 and 125 may be connected to the inductor part L including the first and second internal electrodes 121 and 122.

The multilayer chip electronic component according to an exemplary embodiment of the present disclosure as described above may have a single inductor and two kinds of capacitors of which values may be controlled.

The multilayer chip electronic component according to an exemplary embodiment of the present disclosure has the above-mentioned structure, whereby noise removal efficiency within high frequency regions may be higher as compared with a structure according to the related art and a mounting space and costs required therefor may be reduced due to a decrease in the number of components.

In addition, in the multilayer chip electronic component according to an exemplary embodiment of the present disclosure, the inductor part L may be configured without using the through-hole electrode, whereby a manufacturing cost may be reduced.

In addition, since the through-hole electrode is not used, a connection defect between the through-hole electrode and the internal electrodes may not be present and a manufacturing yield may not be decreased.

Further, since the fourth external electrode 134 is used as a line of the signal as described above, heat generated due to loss of the internal electrodes may be discharged to the outside, such that an allowable current may be set to be high.

Figure 5:
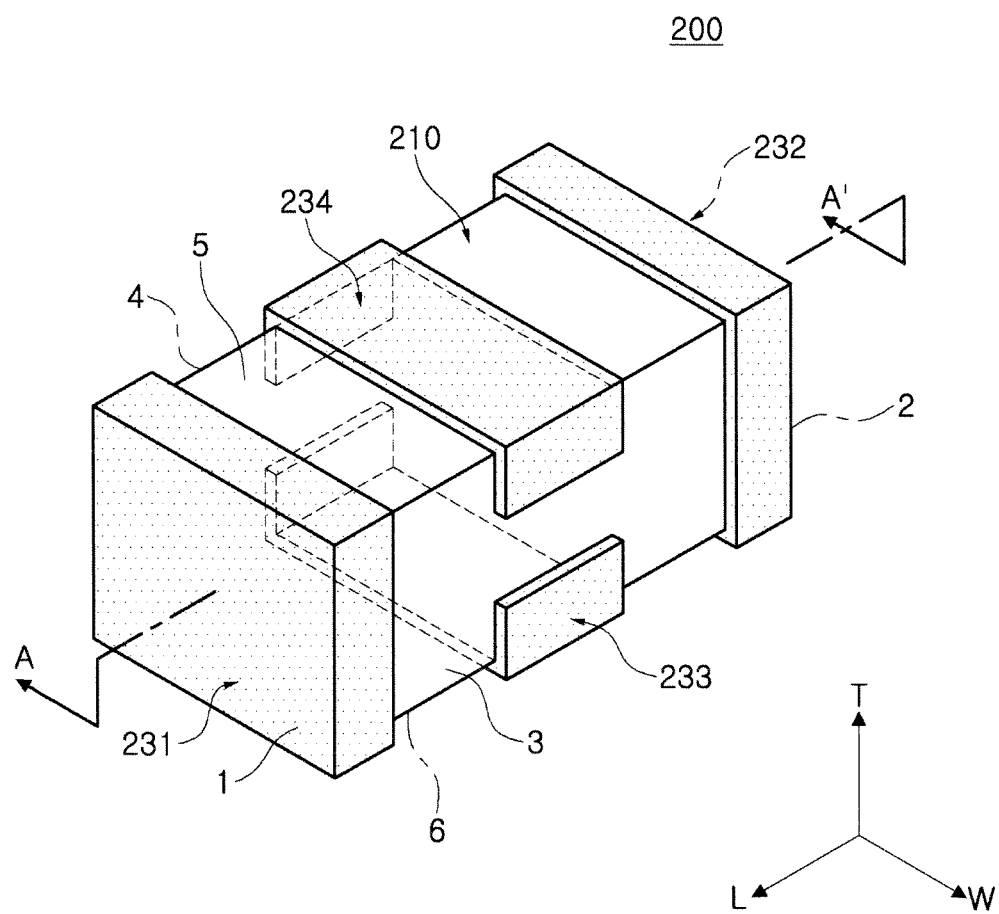
FIG. 5 is a perspective view of a multilayer chip electronic component according to another exemplary embodiment of the present disclosure.

FIG. 5 is a perspective view of a multilayer chip electronic component according to another exemplary embodiment of the present disclosure.

Figure 6:
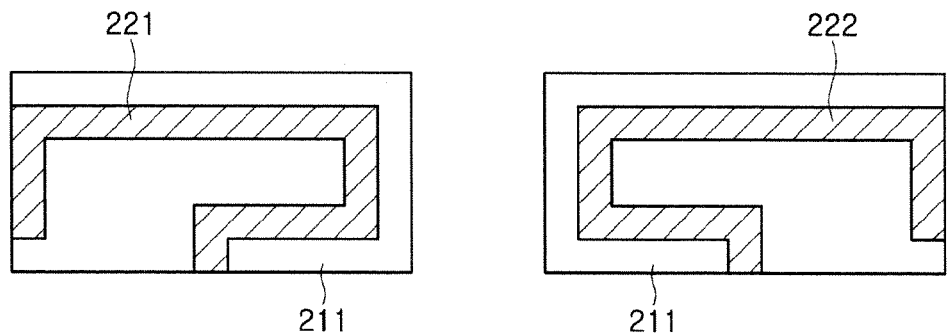
FIG. 6 is a plan view illustrating first and second internal electrodes usable in the multilayer chip electronic component shown in FIG. 5.

FIG. 6 is a plan view illustrating first and second internal electrodes usable in the multilayer chip electronic component shown in FIG. 5.

Figure 7:
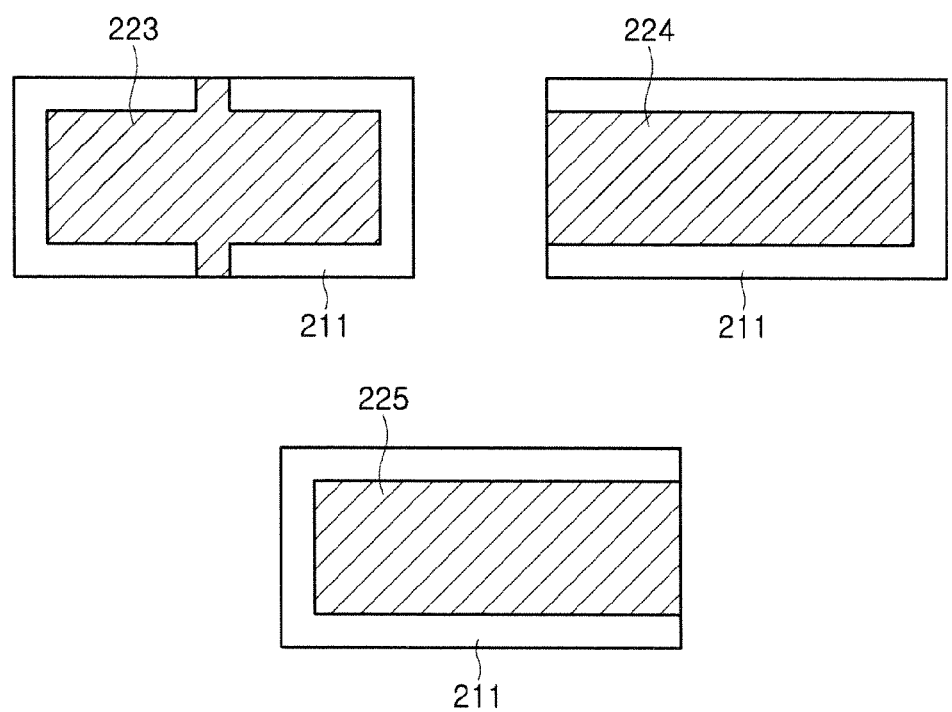
FIG. 7 is a plan view illustrating third to fifth internal electrodes usable together with the first and second internal electrodes shown in FIG. 6.

FIG. 7 is a plan view illustrating third to fifth internal electrodes usable together with the first and second internal electrodes shown in FIG. 6.

Referring to FIGS. 5 through 7, a multilayer chip electronic component 200 according to another exemplary embodiment of the present disclosure may include a ceramic body 210 including a plurality of dielectric layers 211 and having first and second main surfaces 5 and 6 opposing each other, first and second side surfaces 3 and 4 opposing each other, and first and second end surfaces 1 and 2 opposing each other; an inductor part formed within the ceramic body 210 and including first and second internal electrodes 221 and 222, the first internal electrode 221 being exposed to the first side surface 3 and the first end surface 1, and the second internal electrode 222 being exposed to the first side surface 3 and the second end surface 2; a capacitor part formed within the ceramic body 210 and including third to fifth internal electrodes 223 to 225, the third internal electrode 223 being exposed to the first and second side surfaces 3 and 4, the fourth internal electrode 224 being exposed to the first end surface 1, and the fifth internal electrode 225 being exposed to the second end surface 2; and first and second external electrodes 231 and 232 formed on the first and second end surfaces 1 and 2 of the ceramic body 210, respectively, and electrically connected to the first and second internal electrodes 221 and 222 and the fourth and fifth internal electrodes 224 and 225, respectively, a third external electrode 233 extended from the second main surface 6 of the ceramic body 210 to the first and second side surfaces 3 and 4 and connected to the third internal electrode 223, and a fourth external electrode 234 extended from the first main surface 5 of the ceramic body 210 to the first and second side surfaces 3 and 4 and connected to the first and second internal electrodes 221 and 222, wherein the capacitor part is composed of first and second capacitor parts and the inductor part and the capacitor part are connected to each other.

Particularly, in the multilayer chip electronic component 200 according to another exemplary embodiment of the present disclosure, the fourth and fifth internal electrodes 224 and 225 are separately formed on the individual dielectric layers 211.

Since other features of the multilayer chip electronic component according to another exemplary embodiment of the present disclosure are the same as those of the multilayer chip electronic component according to an exemplary embodiment of the present disclosure described above, a description thereof will be omitted.

Board Having Multilayer Chip Electronic Component

Figure 8:
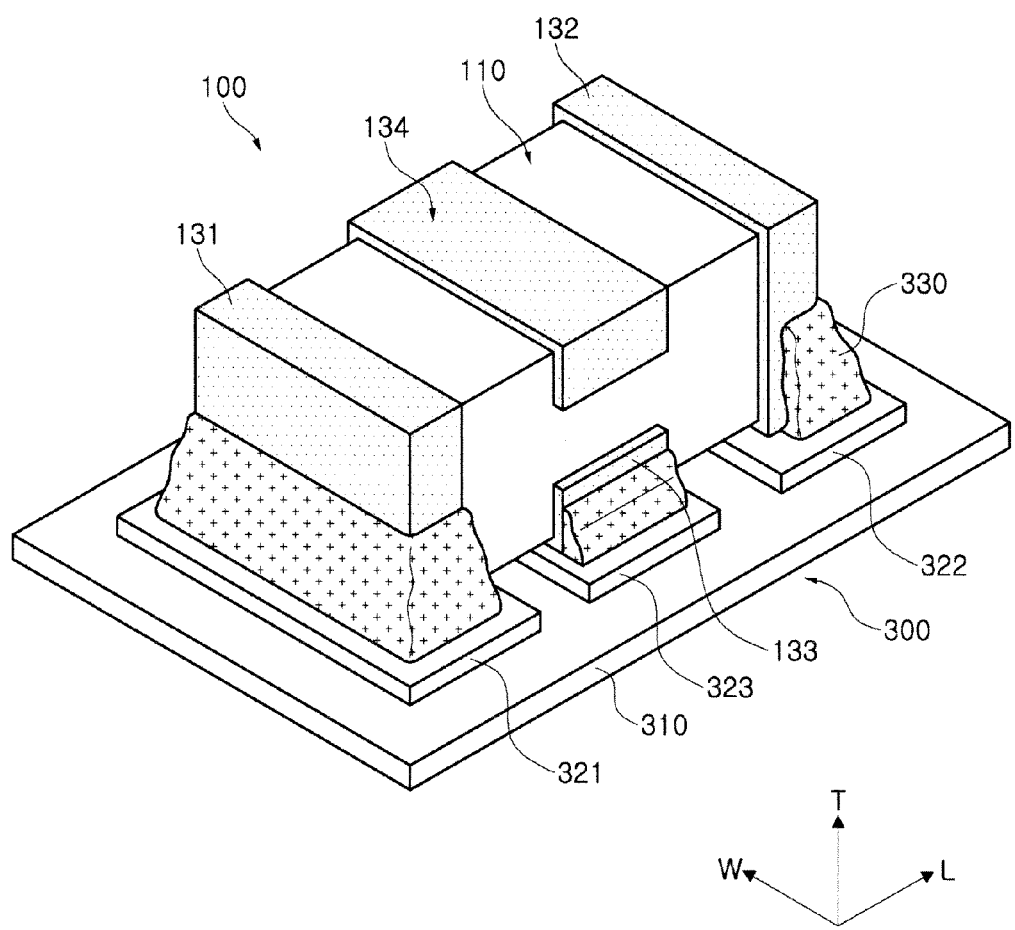
FIG. 8 is a perspective view illustrating a form in which the multilayer chip electronic component of FIG. 1 is mounted on a printed circuit board.

FIG. 8 is a perspective view illustrating a form in which the multilayer chip electronic component of FIG. 1 is mounted on a printed circuit board.

Referring to FIG. 8, a board 300 having a multilayer chip electronic component 100 according to the exemplary embodiment may include a printed circuit board 310 (PCB) on which the internal electrodes of the multilayer chip electronic component 100 are mounted to be horizontal in relation to the PCB and first to third electrode pads 321 to 323 formed on an upper surface of the printed circuit board 310 to be spaced apart from each other.

In this case, the multilayer chip electronic component 100 may be electrically connected to the printed circuit board 310 by solder 330 in a state in which the first to third external electrodes 131 to 133 are positioned on the first to third electrode pads 321 to 323 to come into contact therewith.

The fourth and fifth internal electrodes may be formed on a single dielectric layer to be insulated from each other.

The fourth internal electrode and the fifth internal electrode may be separately formed on the individual dielectric layers.

The first internal electrode is connected to the fourth internal electrode through the first external electrode and the second internal electrode is connected to the fifth internal electrode through the second external electrode, such that the inductor part and the capacitor part may be connected to each other.

The inductor part may be formed so that the signal input to the first external electrode sequentially passes through the first and second internal electrodes and is then output to the second external electrode.

Except for the above-mentioned description, a description of features overlapped with those of the multilayer chip electronic component according to an exemplary embodiment of the present disclosure described as above will be omitted.

As set forth above, according to exemplary embodiments of the present disclosure, the multilayer chip electronic component may include the inductor part and the capacitor part and control respective values of the inductor part and the capacitor part.

Therefore, the multilayer chip electronic component according to exemplary embodiments of the present disclosure may have high noise removal efficiency in high frequency regions as compared to a structure according to the related art, and a mounting space and costs may be decreased due to a decrease in the number of required components.

In addition, in the multilayer chip electronic component according to exemplary embodiments of the present disclosure, since an inductor part is configured without a through-hole electrode, manufacturing costs may be decreased.

In addition, since the through-hole electrode is not used, defective connection between the through-hole electrode and the internal electrode may not occur, and a manufacturing yield may not be decreased.

While exemplary embodiments have been shown and described above, it will be apparent to those skilled in the art that modifications and variations could be made without departing from the spirit and scope of the present disclosure as defined by the appended claims.

What is claimed is:

1. A multilayer chip electronic component comprising:
   a ceramic body including a plurality of dielectric layers and having first and second main surfaces opposing each other, first and second side surfaces opposing each other, and first and second end surfaces opposing each other;
   an inductor part disposed within the ceramic body and including first and second internal electrodes, the first internal electrode being exposed to the first side surface and the first end surface, and the second internal electrode being exposed to the first side surface and the second end surface;
   a capacitor part disposed within the ceramic body and including third to fifth internal electrodes, the third internal electrode being exposed to the first and second side surfaces, the fourth internal electrode being exposed to the first end surface, and the fifth internal electrode being exposed to the second end surface; and
   first and second external electrodes respectively disposed on the first and second end surfaces of the ceramic body and electrically connected to the first and second internal electrodes and the fourth and fifth internal electrodes, a third external electrode extended from the second main surface of the ceramic body to the first and second side surfaces and connected to the third internal electrode, and a fourth external electrode extended from the first main surface of the ceramic body to the first and second side surfaces and connected to the first and second internal electrodes,
   wherein the capacitor part is composed of first and second capacitor parts and the inductor part and the capacitor part are connected to each other.

2. The multilayer chip electronic component of claim 1, wherein the fourth and fifth internal electrodes are disposed on a single dielectric layer and are insulated from each other.

3. The multilayer chip electronic component of claim 1, wherein the fourth and fifth internal electrodes are separately disposed on individual dielectric layers of the plurality of dielectric layers.

4. The multilayer chip electronic component of claim 1, wherein the first internal electrode is connected to the fourth internal electrode through the first external electrode and the second internal electrode is connected to the fifth internal electrode through the second external electrode.

5. The multilayer chip electronic component of claim 1, wherein the inductor part is formed so that a signal inputted to the first external electrode sequentially passes through the first and second internal electrodes and is then outputted to the second external electrode.

6. A board having a multilayer chip electronic component, comprising:
   a printed circuit board having first to third electrode pads disposed thereon; and
   the multilayer chip electronic component mounted on the printed circuit board,
   wherein the multilayer chip electronic component includes: a ceramic body including a plurality of dielectric layers and having first and second main surfaces opposing each other, first and second side surfaces opposing each other, and first and second end surfaces opposing each other, an inductor part disposed within the ceramic body and including first and second internal electrodes, the first internal electrode being exposed to the first side surface and the first end surface, and the second internal electrode being exposed to the first side surface and the second end surface, a capacitor part disposed within the ceramic body and including third to fifth internal electrodes, the third internal electrode being exposed to the first and second side surfaces, the fourth internal electrode being exposed to the first end surface, and the fifth internal electrode being exposed to the second end surface, and first and second external electrodes respectively disposed on the first and second end surfaces of the ceramic body and electrically connected to the first and second internal electrodes and the fourth and fifth internal electrodes, a third external electrode extended from the second main surface of the ceramic body to the first and second side surfaces and connected to the third internal electrode, and a fourth external electrode extended from the first main surface of the ceramic body to the first and second side surfaces and connected to the first and second internal electrodes, the capacitor part being composed of first and second capacitor parts and the inductor part and the capacitor part being connected to each other.

7. The board having a multilayer chip electronic component of claim 6, wherein the fourth and fifth internal electrodes are disposed on a single dielectric layer and are insulated from each other.

8. The board having a multilayer chip electronic component of claim 6, wherein the fourth and fifth internal electrodes are separately disposed on the individual dielectric layers of the plurality of dielectric layers.

9. The board having a multilayer chip electronic component of claim 6, wherein the first internal electrode is connected to the fourth internal electrode through the first external electrode and the second internal electrode is connected to the fifth internal electrode through the second external electrode.

10. The board having a multilayer chip electronic component of claim 6, wherein the inductor part is formed so that a signal inputted to the first external electrode sequentially passes through the first and second internal electrodes and is then outputted to the second external electrode.

* * * * *